United States Patent
Liao et al.

(10) Patent No.: US 11,031,266 B2
(45) Date of Patent: Jun. 8, 2021

(54) WAFER HANDLING EQUIPMENT AND METHOD THEREOF

(71) Applicant: TAIWAN SEMICONDUCTOR MANUFACTURING CO., LTD., Hsinchu (TW)

(72) Inventors: Chih-Hung Liao, New Taipei (TW); Shiao-Ching Wu, Taichung (TW); Jun-Xiu Liu, Taichung (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 16/449,156

(22) Filed: Jun. 21, 2019

(65) Prior Publication Data

US 2020/0020558 A1   Jan. 16, 2020

Related U.S. Application Data

(60) Provisional application No. 62/698,299, filed on Jul. 16, 2018.

(51) Int. Cl.

| | |
|---|---|
| *H01L 21/68* | (2006.01) |
| *H01L 21/67* | (2006.01) |
| *H01L 21/677* | (2006.01) |

(52) U.S. Cl.
CPC .. *H01L 21/67265* (2013.01); *H01L 21/67766* (2013.01); *H01L 21/67781* (2013.01); *H01L 21/67796* (2013.01); *H01L 21/681* (2013.01)

(58) Field of Classification Search
CPC ............. H01L 21/681; H01L 21/67265; H01L 21/67259
See application file for complete search history.

(56) References Cited

U.S. PATENT DOCUMENTS

| | | | | |
|---|---|---|---|---|
| 4,803,373 A | * | 2/1989 | Imamura | H01L 21/67265 250/559.29 |
| 5,003,188 A | * | 3/1991 | Igari | H01L 21/67265 250/223 R |
| 5,418,382 A | * | 5/1995 | Blackwood | H01L 21/67265 250/559.36 |
| 6,147,356 A | * | 11/2000 | Hahn | H01L 21/67265 250/559.29 |
| 6,208,909 B1 | * | 3/2001 | Kato | H01L 21/67265 414/331.14 |
| 7,275,905 B2 | * | 10/2007 | Lee | H01L 21/67259 414/217 |
| 9,786,530 B2 | * | 10/2017 | Lee | H01L 21/68 |
| 2002/0016650 A1 | * | 2/2002 | Beckhart | B25J 9/1697 700/245 |
| 2007/0208453 A1 | * | 9/2007 | Tillman | H01L 21/67265 700/213 |

(Continued)

FOREIGN PATENT DOCUMENTS

JP  2005285799  * 10/2005  ............. H01L 21/68

*Primary Examiner* — Lynn E Schwenning
(74) *Attorney, Agent, or Firm* — Maschoff Brennan

(57) ABSTRACT

A method includes disposing a wafer carrier onto a load port; detecting, by a first sensor in the wafer carrier, an elevation of a slot in the wafer carrier; adjusting an elevation of a wafer transferring device according to the detected elevation of the slot; and moving, at the adjusted elevation of the wafer transferring device, a wafer to the slot by the wafer transferring device.

20 Claims, 5 Drawing Sheets

(56) References Cited

U.S. PATENT DOCUMENTS

2012/0065770 A1* 3/2012 Itou .................. H01L 21/67265
  700/214
2012/0290124 A1* 11/2012 Kimura ............ H01L 21/67265
  700/218
2017/0299407 A1* 10/2017 Li ........................ G01D 5/2412

* cited by examiner

WAFER HANDLING EQUIPMENT AND METHOD THEREOF

PRIORITY CLAIM AND CROSS-REFERENCE

This application claims priority to U.S. Provisional Application Ser. No. 62/698,299, filed Jul. 16, 2018, which is herein incorporated by reference in its entirety.

BACKGROUND

Multiple semiconductor substrates are typically stored and transported together in batches by a wafer carrier throughout a semiconductor fabrication facility (also referred as a "fab") between loadports of different wafer processing tools or equipment. Such tools generally perform various operations photolithography, etching, material/film deposition, curing, annealing, inspection, or other processes used in IC chip manufacturing. The wafer carrier may be a front opening unified pod (FOUP) which is an enclosure designed to hold wafers ranging from 300 mm to 450 mm sizes in a controlled environment. Typically, a wafer carrier holds approximately 25 wafers. The individual wafers are stacked vertically in the FOUP and stored in a wafer support frame with multiple separate wafer shelves or slots.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
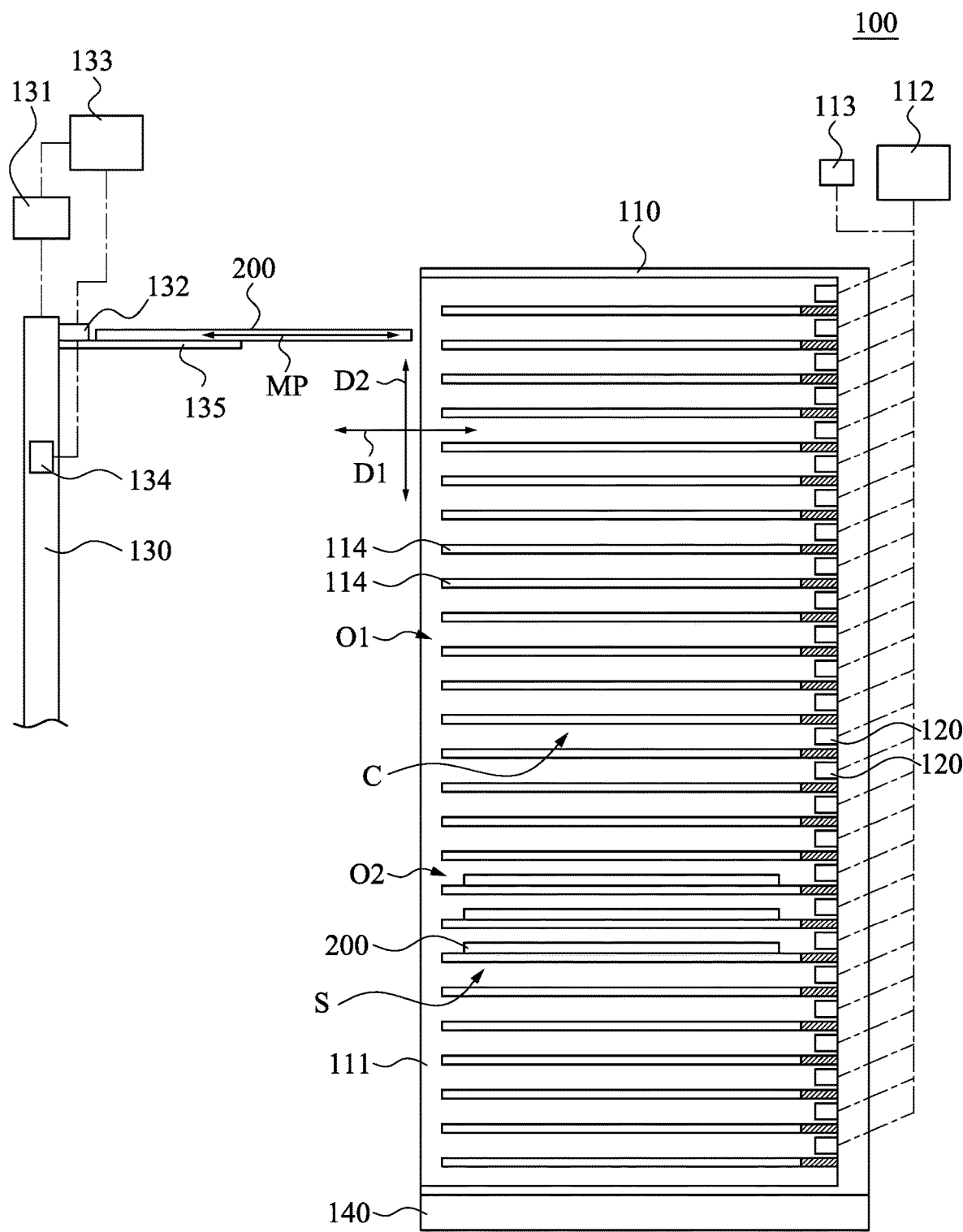
FIG. 1 is a schematic view of a wafer handling equipment in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 2:
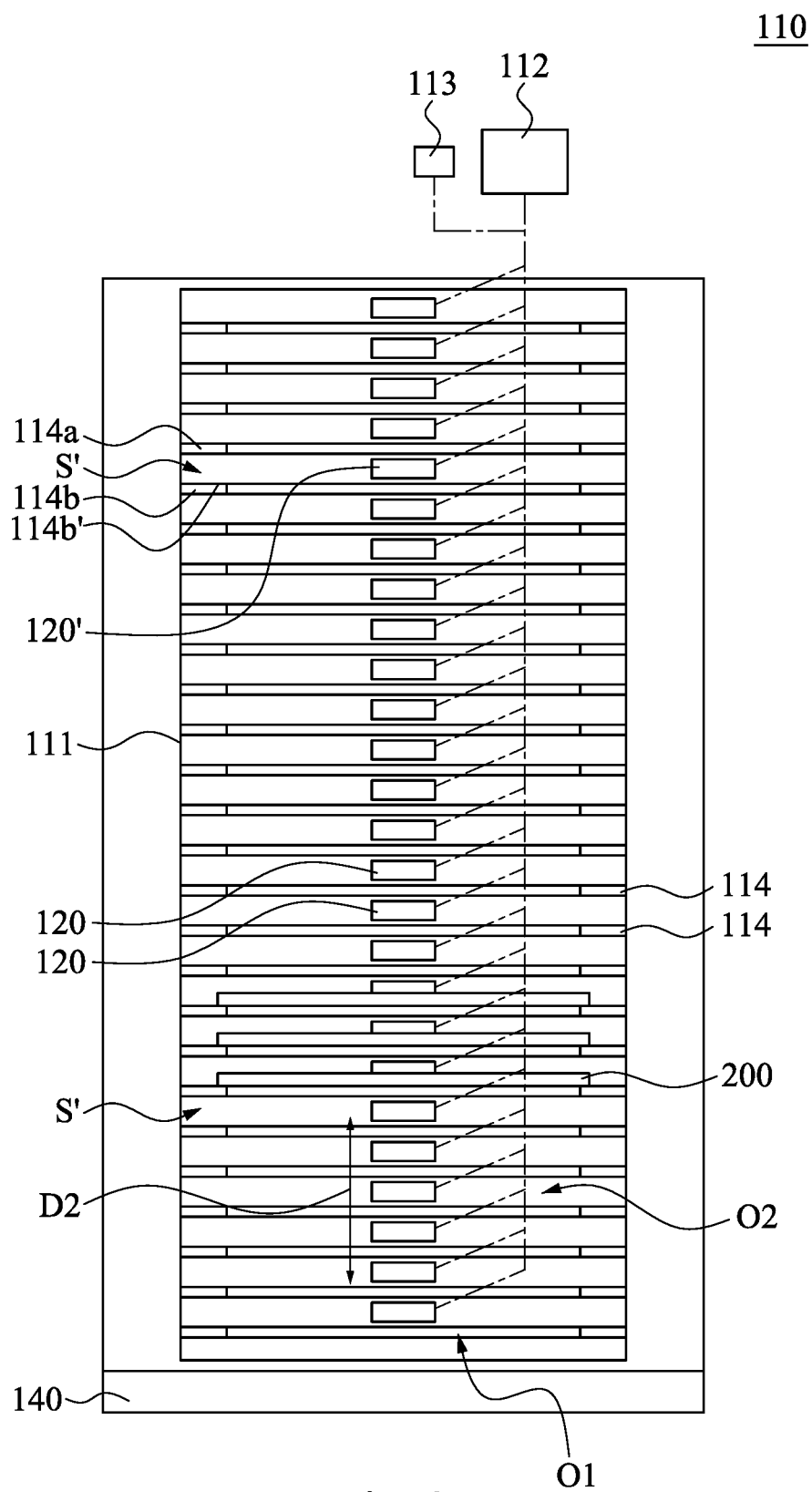
FIG. 2 is a front view of the wafer carrier of FIG. 1.

Reference is made to FIGS. 1 and 2. FIG. 1 is a schematic view of a wafer handling equipment 100 in accordance with some embodiments of the present disclosure. FIG. 2 is a front view of the wafer carrier 110 of FIG. 1. As shown in FIGS. 1-2, some embodiments of the present disclosure provides a wafer handling equipment 100. The wafer handling equipment 100 includes a wafer carrier 110 and a plurality of first sensors 120. In some embodiments, the wafer carrier 110 is a front opening unified pod or a front opening universal pod, both are abbreviated as FOUP. In some embodiments, the wafer handling equipment 100 further includes a load port 140. The wafer carrier 110 is disposed onto the load port 140. The wafer carrier 110 as a FOUP holds a plurality of wafers 200 (a few is shown in FIGS. 1 and 2) securely and safely in a controlled environment, such as a temperature controlled environment, inside the wafer carrier 110. The wafer carrier 110 also allows the wafers 200 to be transferred for processing or measurement by other machines. Moreover, the wafer carrier 110 has a plurality of slots S. The slots S are disposed on an inner wall 111 of the wafer carrier 110, and the first sensors 120 are disposed on the inner wall 111 of the wafer carrier 110 and are located with respect to the positions of the slots S. The first sensors 120 are configured to respectively detect elevations and orientations of the slots S. In other words, the first sensors 120 correspond to the slots S in a one-to-one manner. To be more specific, each of the first sensors 120 is configured to detect an elevation and an orientation of the corresponding slot S. The orientation of the slot S is an angle of which the slot S is inclined relatively to a horizontal level. On the other hand, in some embodiments, the first sensors 120 are infrared radiation (IR) sensors or other suitable sensors.

Structurally speaking, the slots S disposed on the inner wall 111 of the wafer carrier 110 are configured for holding the wafers 200. The wafers 200 are respectively held by the individual slots S. In other words, one of the wafers 200 is held by a particular one of the slots S. The diameter of the wafers 200 that can be held within the wafer carrier 110 can be in a range from about 200 mm to about 480 mm. In some embodiments, the wafer carrier 110 can have more than 25 slots S to hold more than 25 pieces of wafers 200 or less than 25 slots S to hold less than 25 pieces of wafers 200 as maximum.

To be more specific, as shown in FIG. 1, the wafer carrier 110 has a chamber C and a first opening O1. The chamber C is defined by the inner wall 111 of the wafer carrier 110. The chamber C and the first opening O1 are communicated with each other along a first direction D1. The first opening O1 allows the wafers 200 to be placed within or removed from the chamber C of the wafer carrier 110 substantially along the first direction D1. In other words, the wafers 200 pass through the first opening O1 to enter into the chamber C or leave away from the chamber C of the wafer carrier 110. The slots S are arranged in the chamber C of the wafer carrier 110 on the inner wall 111 substantially along a second direction D2. The second direction D2 is substantially orthogonal to the first direction D1. The slots S extend substantially along the first direction D1. In addition, each of the slots S has a second opening O2 facing towards the first opening O1. Each of the second openings O2 is configured for allowing one of the wafers 200 to be inserted into the corresponding slot S. For instance, as shown in FIG. 1, the first direction D1 is substantially horizontal while the second direction D2 is substantially vertical. When one of the wafers 200 is moved into the chamber C through the first opening O1 substantially along the first direction D1 by the wafer transferring device 130, the wafer 200 passes through the corresponding second opening O2 and is inserted into and held by the corresponding slot S of the wafer carrier 110. On the contrary, when one of the wafers 200 is moved away from the chamber C through the first opening O1 substantially along the first direction D1 by the wafer transferring device 130, the wafer 200 is moved away from the corresponding slot S through the corresponding second opening O2. In addition, the wafers 200 are arranged substantially in the second direction D2 in the chamber C of the wafer carrier 110. Meanwhile, the first sensors 120 are disposed in the chamber C substantially along the second direction D2 and away from the first opening O1.

In some embodiments, the wafer carrier 110 includes a door (not shown) covering the first opening O1. When the door is opened, the wafers 200 are allowed to enter into or leave away from the chamber C of the wafer carrier 110. When the door is closed, the chamber C of the wafer carrier 110 is confined, and the wafers 200 are not allowed to enter into or leave away from the chamber C of the wafer carrier 110.

Furthermore, as shown in FIG. 1, the wafer handling equipment 100 further includes a wafer transferring device 130. The wafer transferring device 130 is configured to hold and move one of the wafers 200 to the corresponding slot S in the chamber C through the first opening O1 of the wafer carrier 110. In addition, the wafer transferring device 130 is also configured to hold and move one of the wafers 200 away from the corresponding slot S in the chamber C through the first opening O1 of the wafer carrier 110. In some embodiments, the wafer transferring device 130 can be a robot arm. As mentioned above, each of the first sensors 120 is configured to detect the elevation and the orientation of the corresponding slot S. Meanwhile, an elevation and an orientation of the wafer transferring device 130 is adjustable. The orientation of the wafer transferring device 130 refers to an angle of the wafer 200 inclined to a horizontal level, as held by the wafer transferring 130. To be more specific, an elevation and an orientation of a movement of the wafer transferring device 130 is capable to be adjusted according to the elevation and the orientation of the corresponding slot S detected by the corresponding first sensor 120. In some embodiments, the movement of the wafer transferring device 130 is substantially along the first direction D1. As shown in FIG. 1, the movement of the wafer transferring device 130 creates a moving path MP of the wafer 200 into or away from the chamber C of the wafer carrier 110. By the adjustment of the elevation and the orientation of the movement of the wafer transferring device 130 according to the elevation and the orientation of the corresponding slot S detected by the corresponding first sensor 120, when the wafer 200 is to be moved into or away from the chamber C of the wafer carrier 110 substantially along the first direction D1 by the wafer transferring device 130, the elevation and the orientation of the moving path MP of the wafer 200 is substantially the same as the elevation and the orientation of the corresponding slot S.

When the elevation of the corresponding slot S detected by the corresponding first sensor 120 is higher than the elevation of the movement of the wafer transferring device 130, the wafer transferring device 130 then adjusts the elevation of the movement of the wafer transferring device 130 to a higher elevation, such that the elevation of the movement of the wafer transferring device 130 aligns with the elevation of the corresponding slot S as detected by the corresponding first sensor 120. On the contrary, when the elevation of the corresponding slot S detected by the corresponding first sensor 120 is lower than the elevation of the movement of the wafer transferring device 130, the wafer transferring device 130 then adjusts the elevation of the movement of the wafer transferring device 130 to a lower elevation, such that the elevation of the movement of the wafer transferring device 130 aligns with the elevation of the corresponding slot S as detected by the corresponding first sensor 120.

Since the elevation of the moving path MP of the wafer 200 can be substantially the same as the elevation of the corresponding slot S, provided that the orientation of the moving path MP of the wafer 200 is substantially the same as the orientation of the corresponding slot S as mentioned above, when the wafer 200 enters into the chamber C of the wafer carrier 110, neither the moving wafer 200 nor the wafer transferring device 130 would improperly touch with the inner wall 111 of the wafer carrier 110 or the wafers 200 already inserted into the adjacent slots S. In this way, the chance that the moving wafer 200 or the adjacent wafers 200 get damaged or scratched during the movement of the wafer 200 into the chamber C of the wafer carrier 110 is effectively decreased.

The moving path of the wafer transferring device 130 into or away from the chamber C of the wafer carrier 110 defines the moving path MP of the wafer 200. Thus, the elevation and the orientation of the moving path MP of the wafer 200 is substantially the same as the elevation and the orientation of the moving path of the wafer transferring device 130. In the case when the wafer 200 leaves away from the chamber C of the wafer carrier 110, the wafer transferring device 130 enters into the chamber C of the wafer carrier 110 first without holding any wafer. Since the elevation and the orientation of the moving path of the wafer transferring device 130 is substantially the same as the elevation and the orientation of the moving path MP of the wafer 200 as mentioned above, the elevation and the orientation of the moving path of the wafer transferring device 130 is also the same as the elevation and the orientation of the corresponding slot S. When the wafer transferring device 130 enters into the chamber C of the wafer carrier 110, the wafer transferring device 130 does not improperly touch with the wafer 200 to be moved away, the wafers 200 disposed at the adjacent slots S, nor the inner wall 111 of the wafer carrier 110. In this way, the chance that the wafer 200 to be moved away or the adjacent wafers 200 get damaged or scratched during the movement of the wafer transferring device 130 into the chamber C of the wafer carrier 110 is effectively decreased.

Furthermore, after the wafer transferring device 130 enters into the chamber C of the wafer carrier 110, the wafer 200 to be moved away from the chamber C of the wafer carrier 110 is held by the wafer transferring device 130 and is moved away from the chamber C together with the wafer transferring device 130. Again, since the elevation and the orientation of the moving path of the wafer transferring device 130 is the same as the elevation and the orientation of the corresponding slot S as mentioned above, when the wafer 200 leaves away from the chamber C of the wafer carrier 110, neither the moving wafer 200 nor the wafer transferring device 130 would improperly touch with the inner wall 111 of the wafer carrier 110 or the wafers 200 disposed at the adjacent slots S. In this way, the chance that the moving wafer 200 or the adjacent wafers 200 get damaged or scratched during the movement of the wafer 200 away from the chamber C of the wafer carrier 110 is effectively decreased.

As shown in FIG. 1, the wafer carrier 110 has a signal transmitter 112 while the wafer transferring device 130 has a signal receiver 131. The signal transmitter 112 is electrically connected to the first sensors 120. In some embodiments, the signal transmitter 112 is configured to collect a signal of the elevation and the orientation of the corresponding slot S detected by the corresponding first sensor 120 and transmit the signal to the signal receiver 131. The wafer transferring device 130 is adjustable in height substantially along the second direction D2 and in inclination relative to a horizontal level, according to the signal received by the signal receiver 131. After the signal is transmitted from the signal transmitter 112 to the signal receiver 131, the wafer transferring device 130 then adjusts the elevation and the orientation of the movement of the wafer transferring device 130 according to the signal received by the signal receiver 131.

Furthermore, when the elevation and the orientation of the corresponding slot S detected by the first sensor 120 is out of a pre-determined range, the signal transmitter 112 instantly transmits an alarm signal to the signal receiver 131. After the signal receiver 131 receives the alarm signal, the signal receiver 131 immediately stops the wafer transferring device 130 from moving the wafer 200 to the corresponding slot S. In this way, the chance that the moving wafer 200 or the adjacent wafers 200 get damaged or scratched during the movement of the wafer 200 into the chamber C of the wafer carrier 110 is effectively decreased. In addition, the pre-determined range includes a pre-determined elevation range and a pre-determined angle range of the corresponding slot S. In some embodiments, the pre-determined elevation range ranges between plus and minus about 3 nm. On the other hand, the pre-determined angle range of the corresponding slot S is caused by a height difference of the corresponding slot S. The height difference of the corresponding slot S is the difference in height between the highest point and the lowest point of the corresponding shelf (to be discussed in details below) under the slot S. In some embodiments, this height difference of the corresponding slot S is allowed to be between about 5 mm and about 20 mm.

As shown in FIGS. 1-2, the wafer carrier 110 is disposed with a plurality of shelves 114. The shelves 114 are arranged substantially along the second direction D2 on the inner wall 111 of the wafer carrier 110. The adjacent shelves 114 are separate from each other substantially along the second direction D2. The slots S are located between the adjacent shelves 114 substantially along the second direction D2.

Take the shelves 114a and 114b on FIG. 2 as an example. The slot S' is located between the shelves 114a and 114b. The shelf 114a is on a top of the slot S' while the shelf 114b is below a bottom of the slot S'. The wafer 200 is to be disposed in the slot S' and is to be placed on the upper surface 114b' of the shelf 114b. In some embodiments, the upper surface 114b' of the shelf 114b is taken as a reference elevation. In this case, the first sensor 120' detects the elevation and the inclination, i.e., the orientation, of the upper surface 114b' of the shelf 114b. As mentioned above, the signal transmitter 112 collects the signal from the first sensor 120' and transmits the signal to the signal receiver 131.

When the signal received by the signal receiver 131 of the wafer transferring device 130 reveals that the elevation of the slot S' is higher than the elevation of the movement of the wafer transferring device 130, the wafer transferring device 130 then adjusts the elevation of the movement of the wafer transferring device 130 to a higher elevation, such that the elevation of the movement of the wafer transferring device 130 is higher than the elevation of the slot S'. In some embodiments, the height difference between the elevation of the movement of the wafer transferring device 130 and the elevation of the slot S' is in a range from about 0 nm to about 3 nm. In this way, provided that the orientation of the wafer transferring device 130, i.e., the inclination of the wafer 200 as mentioned above, is aligned with the orientation of the slot S', the wafer 200 can be moved into the chamber C (please refer to FIG. 1) and accessed to the slot S' of the wafer carrier 110 without touching neither the shelf 114a nor the shelf 114b, and the chance that the moving wafer 200 or the adjacent wafers get damaged or scratched during the movement of the wafer 200 into the chamber C of the wafer carrier 110 is effectively decreased.

On the contrary, when the signal received by the signal receiver 131 of the wafer transferring device 130 reveals that the elevation of the slot S' is lower than the elevation of the movement of the wafer transferring device 130, the wafer transferring device 130 then adjusts the elevation of the movement of the wafer transferring device 130 to a lower elevation, such that the elevation of the movement of the wafer transferring device 130 is lower than the elevation of the slot S'. In some embodiments, the height difference between the elevation of the movement of the wafer transferring device 130 and the elevation of the slot S' is in a range from about 0 nm to about 3 nm. Similarly, provided that the orientation of the wafer transferring device 130, i.e., the inclination of the wafer 200 as mentioned above, is aligned with the orientation of the slot S', the wafer 200 can be moved into the chamber C and accessed to the slot S' of the wafer carrier 110 without touching neither the shelf 114a nor the shelf 114b, and the chance that the moving wafer 200 or the adjacent wafers get damaged or scratched during the movement of the wafer 200 into the chamber C of the wafer carrier 110 is effectively decreased.

Furthermore, for example, the elevation of the upper surface 114b' of the shelf 114b is preset to be a specific value for the slot S' relative to the first sensor 120' before the operation of the wafer handling equipment 100. This specific value is the pre-determined elevation of the slot S' which is in turn the standard elevation of the upper surface 114b' of the shelf 114b on which the wafer 200 is disposed.

In practice, a tolerance for the pre-determined elevation of the slot S' is allowed, and the tolerance is defined as the pre-determined range. In some embodiments, for example, the pre-determined range is plus or minus about 3 nm of the pre-determined elevation of the slot S'. This is the range that the wafer 200 can be moved into the chamber C of the wafer carrier 110 without touching the inner wall 111 of the wafer carrier 110. In this way, the chance that the moving wafer 200 and the adjacent wafers 200 get damaged or scratched during the movement of the wafer 200 into the chamber C of the wafer carrier 110 is effectively decreased when the level of the slot S' is within the pre-determined range.

Similarly as mentioned above, when the elevation of the upper surface 114b' of the shelf 114b detected by the first sensor 120 is out of the pre-determined range, the signal transmitter 112 instantly transmits an alarm signal to the signal receiver 131. After the signal receiver 131 receives the alarm signal, the signal receiver 131 immediately stops the wafer transferring device 130 from moving the wafer 200 to the slot S'.

Furthermore, as shown in FIG. 1, the wafer carrier 110 has a first processor 113. The first processor 113 is electrically connected to the first sensors 120, and the first processor 113 is configured to record a used rate of the wafer carrier 110. For example, the first processor 113 records the frequency or the time length of the slots S that the wafers 200 are disposed therein, as a reference of the used rate of the wafer carrier 110. This used rate can be a piece of useful information for the user to arrange maintenance for the wafer carrier 110 in suitable occasions.

Figure 3:
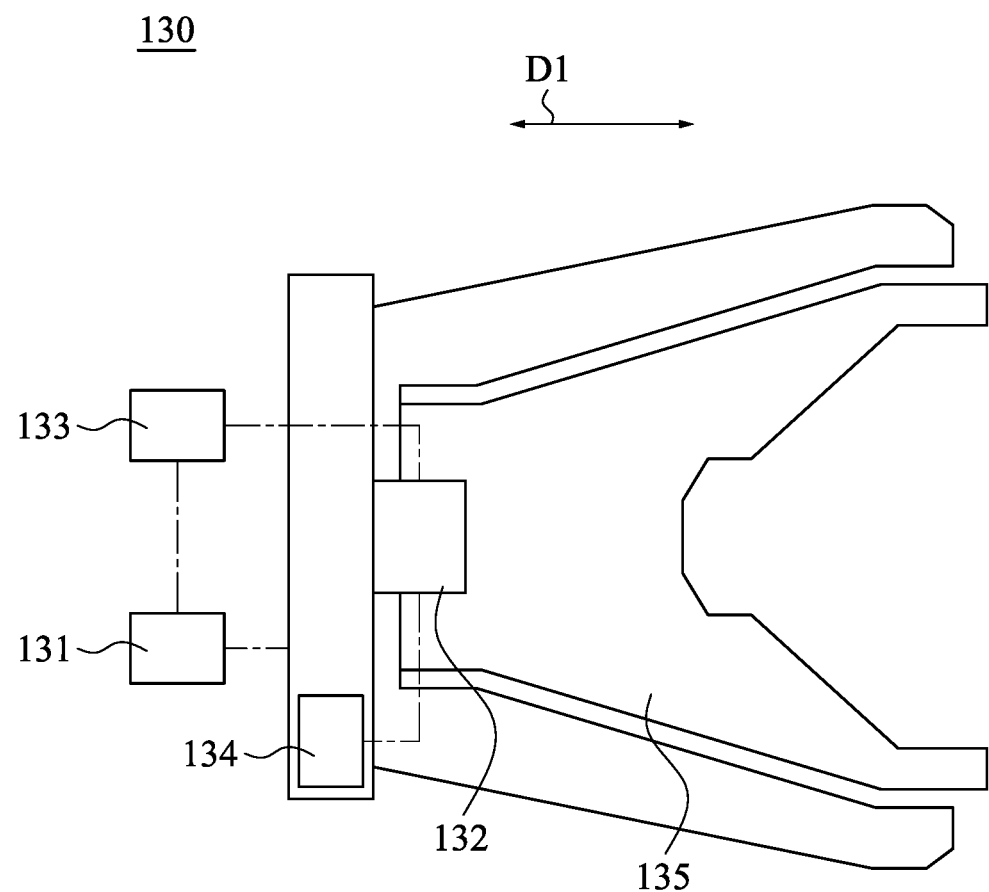
FIG. 3 is a top view of the wafer transferring device of FIG. 1.

Reference is made to FIG. 3. FIG. 3 is a top view of the wafer transferring device 130 of FIG. 1. In some embodiments, as shown in FIGS. 1 and 3, the wafer transferring device 130 has a second sensor 132 and an end effector 135. The end effector 135 is configured for holding the wafer 200. The second sensor 132 is disposed on the wafer transferring device 130 and located at the elevation of the movement of the wafer transferring device 130. The second sensor 132 is configured to align and communicate with the elevation of the corresponding first sensor 120 when the wafer transferring device 130 moves the wafer 200 to the corresponding slot S. In other words, the second sensor 132 detects an alignment of the elevation of the wafer transferring device 130 with the elevation of the corresponding slot S before the wafer 200 is moved to the corresponding slot S. To be specific, when the elevation of the wafer transferring device 130 is detected to be aligned with the elevation of the corresponding slot S, the wafer 200 is moved to the corresponding slot S. On the contrary, when the elevation of the wafer transferring device 130 is detected to be not aligned with the elevation of the corresponding slot S, the movement of the wafer 200 to the corresponding slot S is stopped.

In some embodiments, the second sensor 132 is an infrared radiation (IR) sensor or other suitable sensor. During the operation of the second sensor 132, the second sensor 132 emits an infrared ray to the corresponding first sensor 120. The first sensor 120 then receives the infrared ray as a signal and emits another infrared ray as a feedback signal to the second sensor 132. In case the second sensor 132 receives the feedback signal, the elevation of the movement of the wafer transferring device 130 is determined to be aligned with the elevation of the corresponding slot S. Thus, the wafer 200 is moved to the corresponding slot S.

For the sake of explanation, take the slot S' on FIG. 2 as an example again. The first sensor 120' corresponds to the slot S'. When the wafer 200 is to be moved to the chamber C and to access to the slot S', the elevation of the movement of the wafer transferring device 130 and thus the second sensor 132 on the wafer transferring device 130 are at an elevation that aligns with the first sensor 120', and thus the second sensor 132 receives a feedback infrared ray from the first sensor 120'. Meanwhile, the second sensor 132 detects if the elevation of the movement of the wafer transferring device 130 aligns with the elevation of the corresponding slot S based on whether a feedback infrared ray is received. When the second sensor 132 on the wafer transferring device 130 aligns and communicates with the first sensor 120', the wafer 200 can be moved into the chamber C of the wafer carrier 110 without touching the inner wall 111 of the wafer carrier 110. In this way, the chance that the wafer 200 and the adjacent wafers 200 get damaged or scratched during the movement of the wafer 200 into the chamber C of the wafer carrier 110 is effectively decreased when the elevation of the second sensor 132 on the wafer transferring device 130 aligns with the first sensor 120' and receives a feedback infrared ray from the first sensor 120'.

In addition, as shown in FIGS. 1 and 3, the wafer transferring device 130 has a controller 133 that controls initiation and termination of the movement of the wafer transferring device 130. For example, the controller 133 initiates a horizontal movement of the end effector 135 (i.e., along the first direction D1) forward to the wafer carrier 110 once the end effector 135 is determined as aligned with a corresponding slot S. On the other hand, if the end effector 135 is determined as misaligned with the corresponding slot S during the movement of the end effector 135, the controller 133 immediately stops the movement of the end effector 135 based on the determination. In some embodiments, the controller 133 is electrically connected to the second sensor 132. Moreover, the controller 133 is configured to immediately stop the horizontal movement of the end effector 135 when the second sensor 132 does not receive a feedback infrared ray from the first sensor 120 (i.e., the elevation of the second sensor 132 is different from the elevation of the corresponding first sensor 120).

In some embodiments, the controller 133 further controls initiation and termination of the IR detection operation of the second sensor 132. In greater detail, the controller 133 initiates a vertical movement of the end effector 135 (i.e., along the second direction D2) and stops it at an elevation. After the controller 133 stops the vertical movement of the end effector 135, the controller 133 initiates the IR detection operation of the second sensor 132 to determine whether the elevation of the end effector 135 is aligned with an elevation of the slot S. The second sensor 132 may keep performing the IR detection operation during the horizontal movement of the end effector 135 (i.e., along the first direction D1). After the controller 133 stops the horizontal movement of the end effector 135, the controller 133 may stop the IR detection operation of the second sensor 132.

For the sake of explanation, take the first sensor 120' in FIG. 2 as an example. To be more specific, the elevation of the first sensor 120' is preset to a specific value which is in turn the pre-determined elevation of the first sensor 120' relative to the slot S'.

In practice, a tolerance for the pre-determined elevation of the first sensor 120' is allowed, and the tolerance is defined as the pre-determined range. In some embodiments, for example, the pre-determined range is plus or minus about 3 nm of the pre-determined elevation of the first sensor 120'. This is the range that the wafer 200 can be moved into the chamber C of the wafer carrier 110 without touching the inner wall 111 of the wafer carrier 110. In this way, the chance that the moving wafer 200 and the adjacent wafers 200 get damaged or scratched during the movement of the wafer 200 into the chamber C of the wafer carrier 110 is effectively decreased when the elevation of the second sensor 132 is within the pre-determined range of the first sensor 120'. On the contrary, the controller 133 is configured to stop the wafer transferring device 130 from moving the wafer 200 to the slot S' when the elevation of the second sensor 132 is out of a pre-determined range of the first sensor 120'.

Furthermore, in some embodiments, the controller 133 is electrically connected to the signal receiver 131. When the signal received by the signal receiver 131 of the wafer transferring device 130 reveals that the elevation of the slot S' is higher than the elevation of movement of the wafer transferring device 130, the controller 133 then controls the wafer transferring device 130 to adjust the elevation of movement to a higher elevation, such that the elevation of movement of the wafer transferring device 130 is higher than the elevation of the slot S'. In practice, the height difference between the elevation of movement of the wafer transferring device 130 and the elevation of the slot S' is in the scale of nanometer. In this way, provided that the orientation of the wafer transferring device 130 is aligned with the orientation of the slot S', the wafer 200 can be moved into the chamber C and accessed to the slot S' of the wafer carrier 110 without touching neither the shelf 114a nor the shelf 114b, and the chance that the moving wafer 200 and the adjacent wafers 200 get damaged or scratched during the movement of the wafer 200 into the chamber C of the wafer carrier 110 is effectively decreased.

On the contrary, when the signal received by the signal receiver 131 of the wafer transferring device 130 reveals that the elevation of the slot S' is lower than the elevation of movement of the wafer transferring device 130, the controller 133 then controls the wafer transferring device 130 to adjust the elevation of movement to a lower elevation, such that the elevation of movement of the wafer transferring device 130 is lower than the elevation of the slot S'. In practice, the height difference between the elevation of movement of the wafer transferring device 130 and the elevation of the slot S' is also in the scale of nanometer. Similarly, the wafer 200 can be moved into the chamber C and accessed to the slot S' of the wafer carrier 110 without touching neither the shelf 114a nor the shelf 114b, and the chance that the wafer 200 gets damaged or scratched during the movement of the wafer 200 into the chamber C of the wafer carrier 110 is effectively decreased.

On the other hand, as shown in FIGS. 1 and 3, the wafer transferring device 130 has a second processor 134. The second processor 134 is electrically connected to the second sensor 132, and the second processor 134 is configured to record a used rate of the wafer transferring device 130. For example, the second processor 134 records the quantity of the wafers 200 which are held and moved by the wafer transferring device 130. This used rate can be a piece of useful information for the user to arrange maintenance for the wafer transferring device 130 in suitable occasions.

In a nutshell, with the presence of the first sensors 120 disposed inside the chamber C of the wafer carrier 110 as discussed above, the elevation and the orientation of the respective slots S are detected before the wafers 200 are moved into the chamber C and accessed to the corresponding slots S. Moreover, the first processer 113 can determine whether the detected elevation and orientation of the respective slots S are out of a pre-determined acceptable range before the wafers 200 are moved into the chamber C and accessed to the corresponding slots S. Thus, the chance that the moving wafer 200 or the wafers 200 already in the adjacent slots S get damaged or scratched during the movement of the wafer 200 into the chamber C of the wafer carrier 110 is effectively decreased, even though there is deformation to the wafer carrier 110, abnormal leveling of the load port 140, or unexpected impact such as earthquake, etc.

In addition, with the presence of the second sensor 132 of the wafer transferring device 130, the elevation of movement of the wafer transferring device 130 aligns with the elevation of the corresponding first sensor 120 when the wafer transferring device 130 moves the wafer 200 to the corresponding slot S. Thus, the chance that the moving wafer 200 or the wafers 200 already in the adjacent slots S get damaged or scratched during the movement of the wafer 200 into the chamber C of the wafer carrier 110 is effectively decreased, even though there is deformation to the wafer transferring device 130 or calibration mistake of the wafer handling equipment 100.

As a result, the presence of the first sensors disposed inside the wafer carrier works to assist adjusting the elevation and the orientation of movement of the wafer transferring device with respect to the corresponding slot when a wafer is moved into or away from the wafer carrier. In addition, the presence of the second sensor disposed on the wafer transferring device further assists to detect the alignment of the wafer transferring device to the corresponding slot when the wafer is moved into or away from the wafer carrier. In other words, the presences of the first sensors disposed inside the wafer carrier and the second sensor disposed on the wafer transferring device form two mechanisms working together or individually to guarantee that the wafers are moved into or away from the chamber of the wafer carrier without causing damage or scratch to the wafers.

Figure 4A:
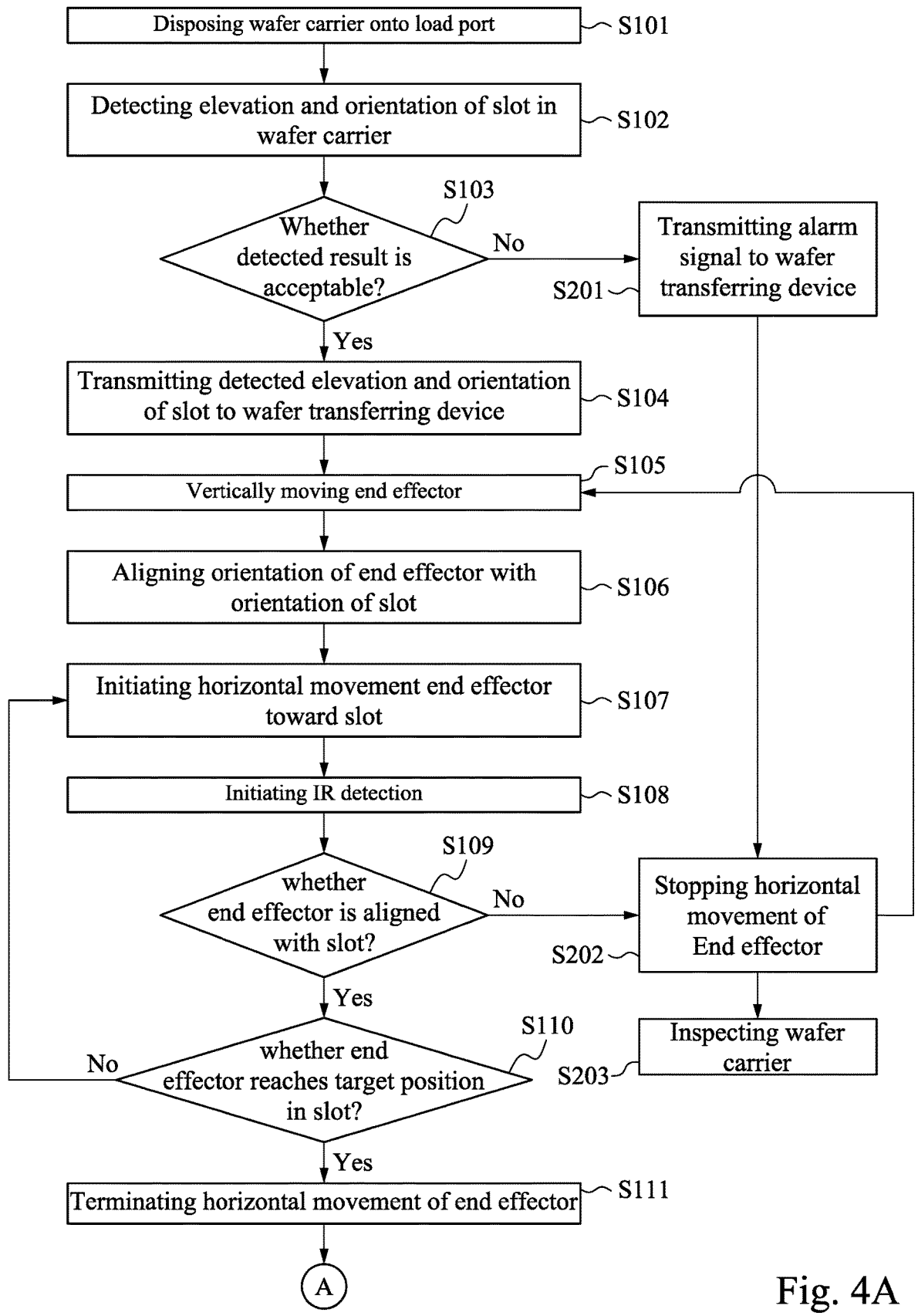
FIGS. 4A and 4B is a flowchart of a method of loading or unloading a wafer in accordance with some embodiments of the present disclosure.
Figure 4B:
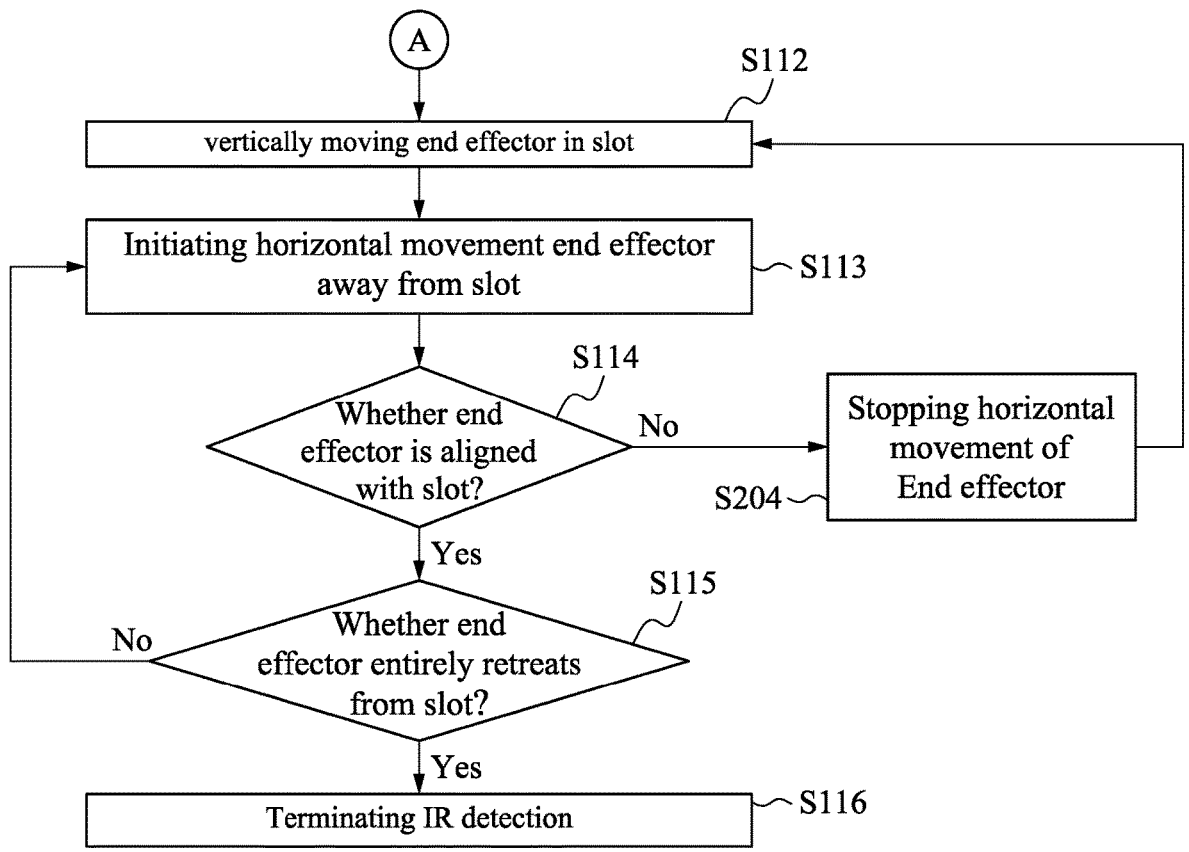

FIGS. 4A and 4B is a flowchart of a method of loading or unloading a wafer in accordance with some embodiments of the present disclosure. The method may be implemented in a fab for performing a semiconductor manufacture process (e.g., deposition, photolithography, etching, chemical mechanical polishing and so on) on the wafer. The method may be performed using a wafer handling equipment as illustrated in FIGS. 1-3, and thus elements of the wafer handling equipment as discussed previously with respect to FIGS. 1-3 will be used in describing the method below for the sake of clarity. It is understood that additional operations may be implemented before, during, and after the method, and some of the operations may be replaced, eliminated, or moved around for additional embodiments of the method.

The method begins at block S101 where the wafer carrier 110 (e.g., FOUP) is disposed onto the load port 140. Disposing the wafer carrier 110 onto the load port 140 may include transporting the wafer carrier 110 using a vehicle of an overhead transport (OHT) system in an automated material handling system (AHMS) to the load port 140. In some embodiments, the load port 140 is of a process chamber such as a deposition chamber, an etching chamber, a chemical mechanical (CMP) and so on. In some embodiments, the load port is of a cluster tool including various processes as discussed above.

The method then proceeds to block S102 where elevations and orientations of the slots S in the wafer carrier 110 are detected. In some embodiments, the elevation and orientation of each slot S can be detected using a corresponding first sensor 120 therein.

The method then proceeds to block S103 by determining whether the detected elevations and orientations of the slots S in the wafer carrier 110 are within a pre-determined acceptable range. This determination can be performed using the first processor 113 that is electrically connected to the first sensors 120. When the determination in block S103 determines that at least one of the detected elevations and orientations of slots S is out of the pre-determined acceptable range, the method proceeds to block S201 where an alarm signal is transmitted from the signal transmitter 112 of the wafer carrier 110 to the signal receiver 131 of the wafer transferring device 130. Once the signal receiver 131 of the wafer transferring device 130 receives the alarm signal, the method proceeds to block S202 by stopping horizontal movement of the end effector 135 if it is horizontally moving. Afterwards, the method optionally proceeds to block S203 by inspecting the wafer carrier 110 manually or automatedly to check whether the wafer carrier 110 is acceptable for containing wafers.

When the determination in block S103 determines that all of the detected elevations and orientations of slots S are within the pre-determined acceptable range, the method proceeds to block S104 where the detected elevations and orientations of slots S are transmitted to the wafer transferring device 130. Transmitting the detected elevations and orientations of slots S can be performed using a wireless communication from the signal transmitter 112 of the wafer carrier 110 to the signal receiver 131 of the wafer transferring device 130.

The method then proceeds to block S105 where the end effector 135 is vertically moved based on one of the detected elevations of slots S. In this way, the end effector 135 can be vertically moved to an elevation aligned with the detected elevation of one slot S, which can be referred to as a target slot S hereinafter. At this step, the elevation of the end effector 135 can be adjusted according to the detected elevation of the target slot S. Vertical movement of the end effector 135 can be performed using a motor (e.g., servo motor) that is mechanically connected with the end effector 135.

After the vertical movement of the end effector 135 is terminated, the method proceeds to block S106 where the end effector 135 is tilted and/or rotated based on the detected orientation of the target slot S. In this way, an orientation of the end effector 135 can be aligned with the detected orientation of the target slot S. Tilting and/or rotating the end effector 135 can be performed using a motor (e.g., servo motor) that is mechanically connected with the end effector 135. In some embodiments where the target slot S is not aslant and remains horizontal as the end effector 135, the step of bock S106 can be skipped.

The method then proceeds to block S107 by initiating a horizontal movement of the end effector 135 toward the target slot S. Horizontal movement of the end effector 135 can be performed using a motor (e.g., servo motor) that is mechanically connected with the end effector 135.

The method then proceeds to block S108 by initiating IR detection. In some embodiments, initiating IR detection includes, for example, starting emitting an infrared ray from the second sensor 132 on the end effector 135 toward the wafer carrier 110, followed by starting detecting a feedback infrared ray from the wafer carrier 110 using the second sensor 132. In some embodiments, the block S108 can be performed before the block S107. In greater detail, the IR detection is initiated prior to initiating the horizontal movement of the end effector 135.

The method then proceeds to block S109 by determining whether the end effector 135 is aligned with the target slot S during the horizontal movement of the end effector 135. In some embodiments, the determination in block S109 includes, for example, determining whether the second sensor 132 receives a feedback infrared ray emitted from the first sensor 120 in the target slot S. When the determination determines that the second sensor 132 does not receive the feedback infrared ray from the first sensor 132 in the target slot S, the end effector 135 is determined as misaligned with the target slot S. When the determination determines that the second sensor 132 receives the feedback infrared ray from the first sensor 132 in the target slot S, the end effector 135 is determined as aligned with the target slot S.

In response to the determination in block S109 determines that the end effector 135 is misaligned with the target slot S, the method then proceeds to block S202 by stopping the horizontal movement of the end effector 135. Afterwards, the method proceeds back to block S105 and continues with the sequence of blocks S106-S109. If the determination in block S109 still determines that the end effector 135 is misaligned with the target slot S, the method will repeat blocks S202 and S105-S109 in sequence until the determination in block S109 determines that the end effector 135 is aligned with the target slot S.

In response to the determination in block S109 determines that the end effector 135 is aligned with the target slot S, and the method then proceeds to block S110 by determining whether the end effector 135 reaches a target position in the target slot S. In some embodiments, the determination in block S110 includes, for example, comparing an intensity of the received feedback infrared ray with a predetermined threshold IR intensity during the horizontal movement of the end effector 135. The end effector 135 is determined as reaching the target position in the target slot S once the intensity of the received feedback infrared ray is higher than the predetermined threshold IR intensity. If the end effector 135 is determined as not reaching the target position in the target slot S, the method proceeds back to block S107 and repeats blocks S107-S110 until the determination in block S110 determines that the end effector 135 reaches the target position in the target slot S.

In response to the determination in block S110 determines that the end effector 135 reaches the target position in the target slot S, the method then proceeds to block S111 by terminating the horizontal movement of the end effector 135.

The method then proceeds to block S112 by vertically moving the end effector 135 in the target slot S. In some embodiments of block S112, if the end effector 135 transports a wafer into the wafer carrier 110, the vertical movement is lowering the end effector 135 to place the wafer onto the shelf 114 at the bottom of the target slot S. In some other embodiments, if the end effector 135 without a wafer thereon is moved into the wafer carrier 110, the vertical movement is lifting the end effector 135 to raise and hold a wafer placed on the shelf 114 at the top of the target slot S.

The method then proceeds to block S113 by initiating a horizontal movement of the end effector 135 away from the target slot S. The horizontal movement in block S113 starts retrieving the end effector 135 from the target slot S. In some embodiments, the horizontal movement in block S113 is performed in a direction opposite the direction of the horizontal movement in block S107.

The method then proceeds to block S114 by determining whether the end effector 135 is aligned with the target slot S during the horizontal movement of the end effector 135 away from the target slot S (i.e., during retrieving the end effector 135 from the target slot S). In some embodiments, the determination in block S114 includes, for example, determining whether the second sensor 132 receives a feedback infrared ray emitted from the first sensor 120 in the target slot S. When the determination determines that the second sensor 132 does not receive the feedback infrared ray from the first sensor 132 in the target slot S, the end effector 135 is determined as misaligned with the target slot S. When the determination determines that the second sensor 132 receives the feedback infrared ray from the first sensor 132 in the target slot S, the end effector 135 is determined as aligned with the target slot S.

In response to the determination in block S114 determines that the end effector 135 is misaligned with the target slot S, the method then proceeds to block S204 by stopping the horizontal movement of the end effector 135 (i.e., stopping retrieving the end effector 135 from the target slot S). Afterwards, the method proceeds back to block S112 and continues with the sequence of blocks S113 and S114. If the determination in block S114 still determines that the end effector 135 is misaligned with the target slot S, the method will repeat blocks S204 and S112-S114 in sequence until the determination in block S114 determines that the end effector 135 is aligned with the target slot S.

In response to the determination in block S114 determines that the end effector 135 is aligned with the target slot S, and the method then proceeds to block S115 by determining whether the end effector 135 entirely retreats from the target slot S. In some embodiments, the determination in block S115 includes, for example, comparing an intensity of the received feedback infrared ray with a predetermined threshold IR intensity during the horizontal movement of the end effector 135 (i.e., during retrieving the end effector 135 from the target slot S). The end effector 135 is determined as entirely retreating from the target slot S once the intensity of the received feedback infrared ray is lower than the predetermined threshold IR intensity. If the end effector 135 is determined as not entirely retreating from the target slot S, the method proceeds back to block S113 and repeats blocks S113-S115 until the determination in block S115 determines that the end effector 135 entirely retreats from the target slot S.

After the end effector 135 is determined as entirely retreating from the target slot S, the method then proceeds to block S116 where the IR detection is terminated. In some embodiments, terminating the IR detection includes, for example, stopping the second sensor 132 on the end effector 135 from detecting the feedback infrared ray and/or emitting the infrared ray toward the wafer carrier 110.

According to the aforementioned embodiments, a method includes disposing a wafer carrier onto a load port; detecting, by a first sensor in the wafer carrier, an elevation of a slot in the wafer carrier; adjusting an elevation of a wafer transferring device according to the detected elevation of the slot; and moving, at the adjusted elevation of the wafer transferring device, a wafer to the slot by the wafer transferring device.

According to the aforementioned embodiments, a method includes disposing a wafer carrier onto a load port; detecting an orientation of a slot in a wafer carrier; aligning an orientation of a wafer transferring device with the orientation of the slot; and moving, with the aligned orientation of the wafer transferring device, a wafer to the slot by the wafer transferring device.

According to the aforementioned embodiments, an apparatus includes a wafer carrier and a plurality of sensors. The wafer carrier has a plurality of slots therein. The slots are configured to allow a plurality of wafers to be disposed therein. The wafer carrier has an inner wall facing the slots. The sensors are arranged on the inner wall of the wafer carrier. Each of the sensors is disposed in one of the slots and is configured to detect a location of the corresponding slot.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
disposing a wafer carrier onto a load port;
detecting, by a first sensor in the wafer carrier, an elevation of a slot in the wafer carrier;
adjusting an elevation of an end effector of a wafer transferring device according to the detected elevation of the slot;
horizontally moving, at the adjusted elevation of the end effector of the wafer transferring device, a wafer to the slot by horizontally moving the end effector of the wafer transferring device;
during horizontally moving the end effector of the wafer transferring device, detecting a radiation from the first sensor by using a second sensor disposed on the wafer transferring device;
determining whether the radiation detected during the horizontal movement of the end effector is within a predetermined threshold; and
in response to determining that the detected radiation during the horizontal movement of the end effector is within the predetermined threshold, determining that the end effector of the wafer transferring device is kept aligned with the slot.

2. The method of claim 1, further comprising:
stopping horizontally moving the wafer to the slot when the elevation of the slot is out of a pre-determined range.

3. The method of claim 2, wherein the pre-determined range is from a pre-determined elevation minus about 3 nm to the pre-determined elevation plus about 3 nm.

4. The method of claim 1, wherein horizontally moving the wafer to the slot comprises:
aligning the second sensor on the wafer transferring device with the first sensor in the wafer carrier.

5. The method of claim 4, wherein aligning the second sensor with the first sensor comprises:
emitting the radiation by the first sensor; and
receiving the radiation by the second sensor.

6. The method of claim 5, wherein the radiation is infrared radiation.

7. The method of claim 4, wherein aligning the second sensor with the first sensor comprises:
emitting the radiation by the second sensor; and
receiving the radiation by the first sensor.

8. The method of claim 1, further comprising:
stopping horizontally moving the wafer to the slot when the second sensor on the wafer transferring device is not aligned with the first sensor.

9. The method of claim 1, further comprising:
emitting the radiation by the first sensor; and
stopping horizontally moving the wafer to the slot when the radiation emitted by the first sensor is not received by the second sensor on the wafer transferring device.

10. The method of claim 1, further comprising:
emitting radiation by the second sensor on the wafer transferring device; and
stopping horizontally moving the wafer to the slot when the radiation emitted by the second sensor is not received by the first sensor.

11. A method, comprising:
disposing a wafer carrier onto a load port;
detecting, by a first sensor in the wafer carrier, an orientation of a slot in the wafer carrier;
aligning an orientation of a wafer transferring device with the orientation of the slot;

moving, with the aligned orientation of the wafer transferring device, a wafer to the slot by the wafer transferring device;
during moving the wafer to the slot, detecting a radiation from the first sensor by using a second sensor disposed on an end effector of the wafer transferring device;
determining whether an intensity of the radiation is higher than a predetermined threshold intensity; and
in response to determining that the intensity of the detected radiation is higher than the predetermined threshold intensity, terminating the movement of the wafer.

12. The method of claim 11, further comprising:
stopping moving the wafer to the slot when the orientation of the slot is out of a pre-determined range.

13. The method of claim 12, wherein the pre-determined range is a height difference of the slot ranging from about 5 mm to about 20 mm.

14. The method of claim 11, wherein moving the wafer to the slot comprises:
aligning the second sensor on the wafer transferring device with the first sensor in the wafer carrier.

15. The method of claim 11, further comprising:
stopping moving the wafer to the slot when the second sensor on the wafer transferring device is not aligned with the first sensor.

16. The method of claim 11, further comprising:
emitting the radiation by the first sensor; and
stopping moving the wafer to the slot when the radiation emitted by the first sensor is not received by the second sensor on the wafer transferring device.

17. The method of claim 16, wherein the radiation is infrared radiation.

18. The method of claim 11, further comprising:
emitting radiation by the second sensor on the wafer transferring device; and
stopping moving the wafer to the slot when the radiation emitted by the second sensor is not received by the first sensor.

19. An apparatus, comprising:
a wafer carrier having a plurality of slots therein, wherein the slots are configured to allow a plurality of wafers to be disposed therein, the wafer carrier has an inner wall facing the slots;
a plurality of first sensors arranged on the inner wall of the wafer carrier, wherein each of the first sensors is disposed in one of the slots and is configured to detect a location of the corresponding slot;
a wafer transferring device;
a second sensor on the wafer transferring device; and
a controller configured to immediately stop a horizontal movement of an end effector of the wafer transferring device when the second sensor does not receive a feedback infrared ray from one of the first sensors.

20. The apparatus of claim 19, further comprising:
a plurality of shelves extending from the inner wall of the wafer carrier to an opening of the wafer carrier, wherein the first sensors and the shelves are arranged in an alternating manner.

* * * * *